(12) United States Patent
Tomioka (10) Patent No.: US 6,656,269 B2
(45) Date of Patent: Dec. 2, 2003

(54) METHOD OF MANUFACTURING NITRIDE SYSTEM III-V COMPOUND LAYER AND METHOD OF MANUFACTURING SUBSTRATE

(75) Inventor: Satoshi Tomioka, Kanagawa (JP)

(73) Assignee: Sony Corporation, Tokyo (JP)

( * ) Notice: Subject to any disclaimer, the term of this patent is extended or adjusted under 35 U.S.C. 154(b) by 10 days.

(21) Appl. No.: 09/729,212

(22) Filed: Dec. 5, 2000

(65) Prior Publication Data

US 2001/0000733 A1 May 3, 2001

(30) Foreign Application Priority Data

Aug. 12, 1999 (JP) .......................................... P11-376422

(51) Int. Cl.⁷ .............................................. C30B 25/16
(52) U.S. Cl. ..................... 117/89; 117/101; 117/102; 117/105; 117/952
(58) Field of Search ........................ 117/89, 101, 102, 117/105, 952

(56) References Cited

U.S. PATENT DOCUMENTS 5,602,418 A * 2/1997 Imai et al. .................. 257/627
6,218,280 B1 * 4/2001 Kryliouk et al. ............ 438/607
6,319,742 B1 * 11/2001 Hayashi et al. ............... 438/46

* cited by examiner

*Primary Examiner*—Robert Kunemund
(74) *Attorney, Agent, or Firm*—Rader, Fishman & Grauer PLLC; Ronald P. Kananen (57) ABSTRACT

Provided is a method of manufacturing a nitride system III–V compound layer which improves the quality and facilitates the manufacturing process and a method of manufacturing a substrate employing the method of manufacturing a nitride system III–V compound layer. A first growth layer is grown on a growth base at a growth rate, in a vertical direction to the growth surface, higher than 10 $\mu$m/h. Subsequently, a second growth layer is grown at a growth rate, in a vertical direction to the growth surface, lower than 10 $\mu$m/h. The first growth layer grown at the higher growth rate has a rough surface. However, the second growth layer is grown at the lower growth rate than that used for growing the first growth layer, so that depressions of the surface of the first growth layer are filled and thus the surface of the second growth layer is flattened. Further, growth takes place laterally so as to fill the depressions of the surface of the first growth layer. Thus, dislocation extending from the first growth layer bends laterally and density of dislocation propagating to the surface of the second growth layer is greatly lowered.

16 Claims, 5 Drawing Sheets

METHOD OF MANUFACTURING NITRIDE SYSTEM III-V COMPOUND LAYER AND METHOD OF MANUFACTURING SUBSTRATE

BACKGROUND OF THE INVENTION

1. Field of the Invention

The present invention relates to a method of manufacturing a nitride system III-V compound layer including a group III element and nitrogen (N) as a group V element and a method of manufacturing a substrate employing the method of manufacturing a nitride system III-V compound layer.

2. Description of the Related Art

In recent years, demand for high density or high resolution recording/reproducing in optical disks and magnetic optical disks has grown. To fulfill this demand, research on semiconductor devices capable of emitting lights in a short-wavelength range within an ultraviolet spectrum or a green-wavelength spectrum has been actively conducted. As suitable materials constituting such a semiconductor device capable of emitting lights in the short-wavelength range, nitride system III-V compound semiconductors such as GaN, AlGaN mixed crystal or GaInN mixed crystal are known (Jpn. J. Appl. Phys., 30 (1991), L1998).

Generally, light-emitting devices using the nitride system III-V compound semiconductor are manufactured by sequentially growing layers made of the nitride system III-V compound semiconductor on a substrate using a metal organic chemical vapor deposition (MOCVD) method or a using a metal organic chemical vapor deposition (MOCVD) method or a molecular beam epitaxy (MBE) method. As the substrate, a sapphire ($Al_2O_3$) substrate or a silicon carbide (SiC) substrate is used in general.

However, a lattice constant and a thermal expansion coefficient of sapphire and silicon carbide and those of the nitride system III-V compound semiconductor are different, so that there is a problem such that defects or cracks occur in a grown nitride system III-V compound semiconductor layer. Further, when manufacturing a semiconductor laser diode (LD) as a semiconductor light-emitting device, it is difficult to perform cleavage in order to form end faces of a resonator.

These problems are considered to be solved by the use of a substrate made of nitride system III-V compounds. In a case where the nitride system III-V compound semiconductor layer is grown on the substrate made of the nitride system III-V compound, occurrence of defects or cracks is suppressed because their lattice constants and thermal expansion coefficients are almost identical. Further, when manufacturing a semiconductor laser, for formation of end faces of a resonator, cleavage is easily performed. Accordingly, it is considered that a highly reliable semiconductor light-emitting device is manufactured with excellent yield.

The nitride system III-V compound has a high saturated vapor pressure. Thus, a manufacturing method which is generally used when manufacturing a substrate made of silicon (Si) or a substrate made of gallium arsenide (GaAs) cannot be used for manufacture of the substrate made of the nitride system III-V compound. Heretofore a well-known method for manufacturing the substrate made of the nitride system III-V compound is a method such that the nitride system III-V compound is grown on a growth base made of sapphire or gallium arsenide to achieve a predetermined thickness using a MOCVD method, MBE method or hydride vapor phase epitaxy (HVPE) method in which hydride is used as a source material. With the use of the HVPE method among these method, the nitride system III-V compound can be grown for several $\mu$m to several hundreds $\mu$m per one hour, thus the nitride system III-V compound can be grown to achieve a usable thickness as a substrate for a short period of time. As such a nitride system III-V compound substrate manufactured using the HVPE method, a nitride system III-V compound substrate manufactured by growing GaN on the aforementioned growth base has been reported.

Further, a method such that a buffer layer such as a low temperature buffer layer is provided on a growth base and a nitride system III-V compound is grown on the buffer layer, thereby manufacturing the nitride system III-V compound substrate is known.

However, with the method of growing the nitride system III-V compound substrate directly on the growth base, the condition of the surface after growth is bad, and further the quality is not sufficient for the use as a substrate for growing a good-quality nitride system III-V compound semiconductor.

Moreover, with the method for growing the nitride system III-V compound on a growth base having the buffer layer in between, an extra step for providing the buffer layer is necessary, which lowers productivity. Specifically, when a low temperature buffer layer is provided as the buffer layer, after performing cleaning or the like on the growth base in the high temperature environment, a temperature has to be lowered once, which further lowers the productivity.

SUMMARY OF THE INVENTION

The present invention has been achieved in view of the above problems. It is an object of the invention to provide a method of manufacturing a nitride system III-V compound layer which improves the quality and facilitates the manufacturing process and a method of manufacturing a substrate employing the method of manufacturing a nitride system III-V compound layer.

According to the present invention, a method of manufacturing a nitride system III-V compound layer including at least one selected from a group consisting of gallium (Ga), aluminum (Al), boron (B) and indium (In) as a group III element and at least nitrogen (N) as a group V element comprises a first growth step for growing a first growth layer including a nitride system III-V compound at a first growth rate, and a second growth step for growing a second growth layer including a nitride system III-V compound at a second growth rate lower than the first growth rate.

According to the invention, a method of manufacturing a substrate made of a nitride system III-V compound including at least one selected from a group consisting of gallium (Ga), aluminum (Al), boron (B) and indium (In) as a group III element and at least nitrogen (N) as a group V element comprises a first growth step for growing a first growth layer including the nitride system III-V compound at a first growth rate, and a second growth step for growing a second growth layer including the nitride system III-V compound at a second growth rate lower than the first growth rate.

With the method of manufacturing a nitride system III-V compound layer of the invention and the method of manufacturing a substrate of the invention, the first growth layer is grown at the first growth rate and the second growth layer is grown at the second growth rate lower than the first growth layer.

Other and further objects, features and advantages of the invention will appear more fully from the following description.

DETAILED DESCRIPTION OF THE PREFERRED EMBODIMENTS

An embodiment of the present invention will be described below in detail with reference to the accompanying drawings.

A method of manufacturing a nitride system III–V compound layer of an embodiment of the present invention is a method for manufacturing a nitride system III–V compound layer including at least one selected from the group consisting of gallium (Ga), aluminum (Al), boron (B) and indium (In), as a group III element and at least nitrogen (N) as a group V element. Examples of such a nitride system III–V compound is GaN, InN, AlN, AlGaN mixed crystal, GaInN mixed crystal or AlGaInN mixed crystal. This nitride system III–V compound layer may include n-type impurities or p-type impurities as needed.

Figure 1A:
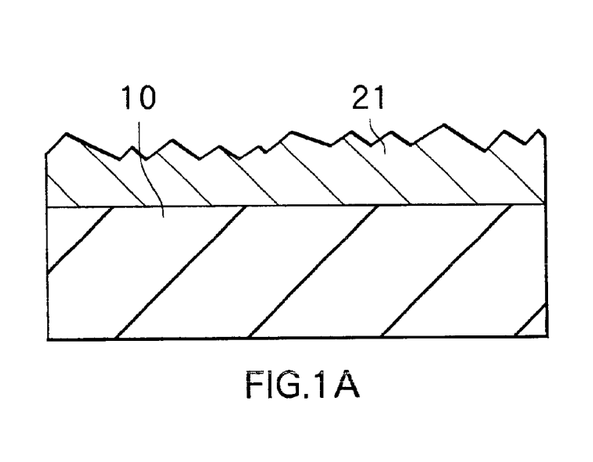
FIGS. 1A and 1B are cross sections of a manufacturing step of a method of manufacturing a nitride system III–V compound layer according to an embodiment of the invention.
Figure 1B:
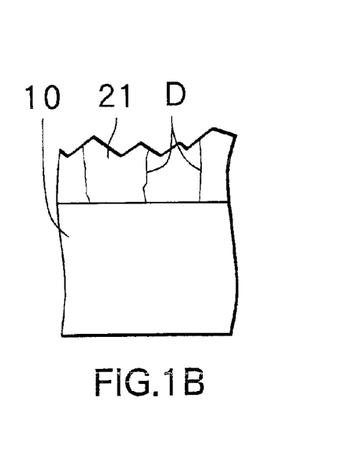
Figure 2A:
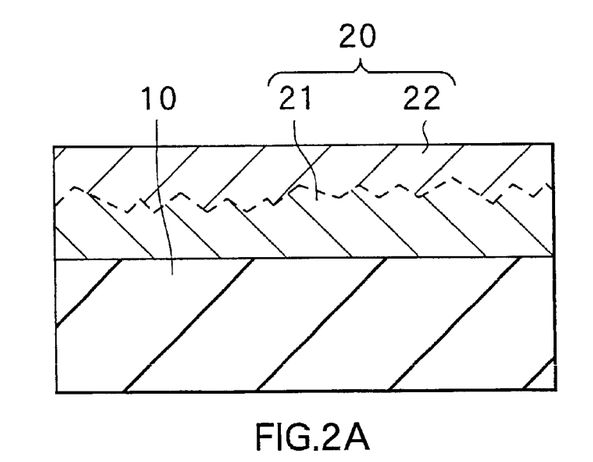
FIGS. 2A and 2B are cross sections of a manufacturing step following the sep of FIGS. 1A and 1B.
Figure 2B:
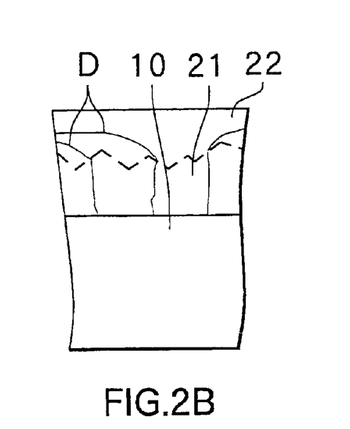

FIGS. 1A to 2B show manufacturing steps of the method of manufacturing a nitride system III–V compound layer according to the present invention. FIGS. 1B and 2B show portions of FIGS. 1A and 2A, respectively.

With the embodiment, as shown in FIGS. 1A and 1B a growth base 10, which is made of, e.g., sapphire ($Al_2O_3$), silicon carbide (SiC) or spinel ($MgAl_2O_4$) is prepared and cleaned with, e.g., an organic solvent.

Subsequently, after performing thermal cleaning on the growth base 10 by means of heating, for example, the aforementioned nitride system III–V compound is grown on the growth base 10 (on the c-plane when the growth base 10 is made of sapphire, for example) to achieve a desired thickness (e.g. 200 □m) using, e.g., a hydride vapor phase epitaxy (VPE) method, thus a first growth layer 21 is formed (First growth step). At this time, a growth rate in a vertical direction to the growth surface (the surface of the growth base 10) is over 10 □m/h, for example. Preferably, the growth is performed so as to make the growth rate as high as possible, so long as it does not exert an adverse effect on the base 10. In order to achieve preferable crystallinity of the first growth layer 21, desirably the growth rate in a vertical direction to the growth surface is below 100 □m/h. Here, the HVPE method denotes a vapor phase growth method using halide or hydride as a source gas.

Specifically, the first growth layer 21 is formed by growing GaN in the following manner, for example. First, the growth base 10 is heated to about 1000° C. by a heating means (not shown), e.g., an electric furnace. Then, on the growth base 10 supplied is a ammonia gas ($NH_3$) as a nitrogen source at a flow rate of 1 lit./min. and a gallium chloride gas (GaCl) which is obtained by flowing hydrogen chloride gas (HCl) at a flow rate of 0.03 lit./min.(30 ccm) on a simple substance of gallium (gallium metal) which is heated to approximately 850° C. as a gallium source. Nitrogen gas ($N_2$) is used as a carrier gas and the flow rate is 1 lit./min. In this case, the growth rate of the nitride system III–V compound is controlled by adjusting a supply of the hydrogen chloride gas. In this manner growth is performed for a few hours, for example. Thus, formed is the first growth layer 21 made of GaN with a thickness of about 200 $\mu$m.

Figure 3:
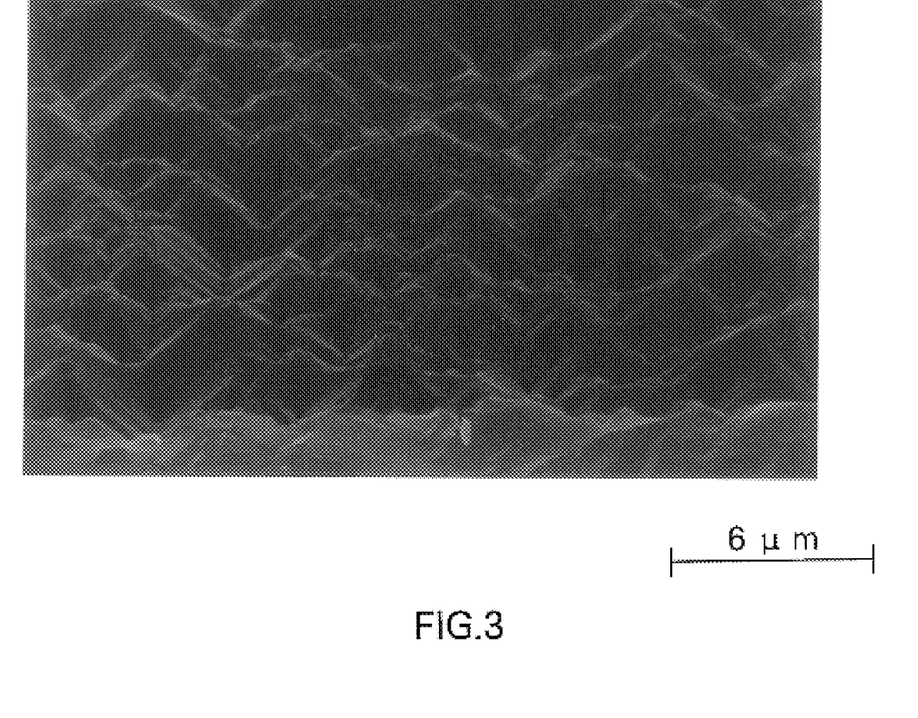
FIG. 3 is a micrograph showing the structure of a surface of a first growth layer formed in one manufacturing step of the method of manufacturing a nitride system III–V compound layer according to the embodiment of the invention.

FIG. 3 is a micrograph of the surface of the first growth layer 21 taken by an electric microscope after the first growth layer 21 is formed by growing GaN under the above condition. As seen from FIG. 3, the surface of the first growth layer 21 is rough having mountain-shaped projections, for example. As indicated in a slender line in FIG. 1B, dislocation D extending along the direction of stacking with a high density (e.g., approximately $10^9$–$10^{10}$ per $cm^2$) occurs in the first growth layer 21.

The above description is given by using GaN as a specific example. However, when another nitride system III–V compound is subject to growth, the following source materials are used, for example; a simple substance of aluminum for aluminum, a simple substance of boron for boron and a simple substance of indium for indium.

After forming the first growth layer 21, for example, as shown in FIGS. 2A and 2B the same group III–V nitride compound as the nitride system III–V compound constituting the first growth layer 21 is grown on the first growth layer 21 at a growth rate lower than that used when growing the first growth layer 21, whereby a second growth layer 22 is formed (Second growth process). For the formation of the second growth layer 22, the growth rate in a vertical direction to the growth surface is below 10 $\mu$m/h, for example. To grow the nitride system III–V compound with preferable crystallinity, the growth rate in a vertical direction to the growth surface is preferably about 5 $\mu$m/h.

The second growth layer 22 is formed by growing the nitride system III–V compound using, for example, any one of a HVPE method or MOCVD method or MBE method.

When the HVPE method is used, GaN is grown using the same source materials as those used for the formation of the first growth layer 21 at the flow rate of hydride chloride gas, 0.003 lit./min. (3 ccm), for example.

GaN is grown using the MOCVD method as follows, for example: First, the growth base 10 is set inside of a reaction tube in a MOCVD apparatus (not shown); ammonia as a nitrogen source and a mixed gas of hydrogen gas ($H_2$) and nitrogen gas ($N_2$) as a carrier gas are supplied into the reaction tube and simultaneously the growth base 10 is heated to 1050° C.; and subsequently gallium source is supplied thereon, thereby growing GaN. As the gallium source, trimetylgallium (TMG;$(CH_3)_3Ga$) or trietylgallium (TEG;$(C_2H_5)_3Ga$) is used, for example. When another nitride system III–V compound is subjected to growth, the following source materials are used, for example: trimethylaluminum ($(CH_3)_3Al$) for aluminum, triethylboron ($(C_2H_5)_3$ B) for boron and trimethylindium ($(CH_3)_3In$) for indium.

When GaN is grown using the MBE method, the growth base 10 is set inside of a chamber in an MBE apparatus (not shown), for example. Subsequently, the growth base 10 is heated to, e.g., 750° C. in the presence of nitrogen plasma as a nitrogen source and then a gallium atomic beam as a gallium source is supplied to grow GaN. Ammonia may be directly supplied as a nitrogen source. Here, aluminum atomic beams are used as an aluminum source and boron atomic beams are used as a boron source, for example. As an indium source, indium atomic beams are used, for example.

With the use of any methods described above, growth takes place laterally so as to fill the depressions of the surface of the first growth layer 21. Thus, the dislocation D extending from the first growth layer 21 bends laterally as illustrated in FIG. 2B, so that the density of the dislocation D propagating to the surface of the second growth layer 22 can be greatly lowered to the order of $10^6$ per $cm^2$, for example.

Figure 4:
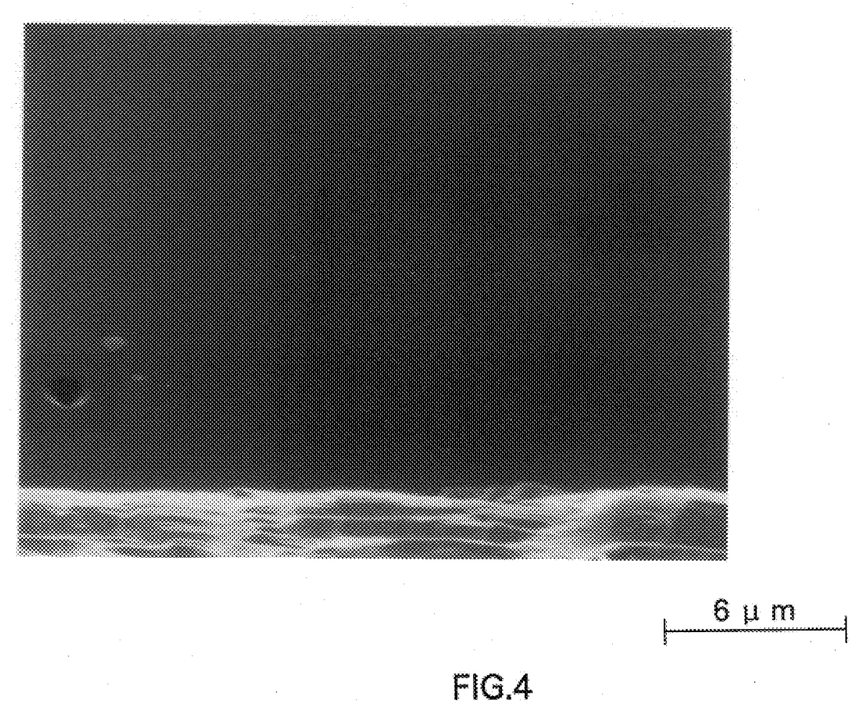
FIG. 4 is a micrograph showing the structure of a surface of a second growth layer formed in one manufacturing step of the method of manufacturing a nitride system III–V compound layer according to the embodiment of the invention.

As described above, the depressions of the surface of the first growth layer 21 are filled, and the nitride system III–V compound is grown for a certain period of time so as to flatten the surface of the second growth layer 22. As shown in FIG. 4, the second growth layer 22 with the flatten surface is formed, whereby a nitride system III–V compound layer 20 (FIG. 2) composed of the first growth layer 21 and the second growth layer 22 is formed. FIG. 4 is a micrograph of the surface of the second growth layer 22 taken by an electric microscope after the second growth layer 22 is formed by growing GaN under the aforementioned condition using the HVPE method.

Alternatively, an n-type or p-type nitride system III–V compound layer 20 may be manufactured by doping n-type or p-type impurities in at least either the first growth layer 21 or the second growth layer 22. As the n-type impurities, at least one element selected from the group consisting of carbon (C), silicon (Si), germanium (Ge), tin (Sn), sulfur (S), selenium (Se) and tellurium (Te), is preferably included, the carbon, the silicon, the germanium and the tin comprising group IV elements and the sulfur, the selenium and the tellurium comprising group VI elements. As the p-type impurities, al least one element from the group consisting of beryllium (Be), magnesium (Mg), calcium (Ca), zinc (Zn), cadmium (Cd) and carbon, silicon, germanium and tin is preferably included, the beryllium, the magnesium, the calcium, the zinc and the cadmium comprising group II elements and the carbon, the silicon, the germanium and the tin comprising group IV elements.

When the first growth layer 21 or the second growth layer 22 which is doped with impurities is grown using the HVPE method, the following source materials are used, for example: methane ($C_2H_6$) for carbon source, silane ($SiH_4$) or silicon chloride ($SiCl_4$) for silicon source, german ($GeH_4$) for germanium source, dimethltellurium (($CH_3$)$_2$Te) for tellurium source, bis=cyclopentadienylmagnesium (($C_5H_5$)$_2$Mg) for magnesium source, monometylcalcium for calcium source, dimetylzinc (($CH_3$)$_2$Zn) for zinc source and dimethycadmium (($CH_3$)$_2$Cd) for cadmium source.

With reference to FIGS. 5A to 6B, a method of manufacturing a substrate employing the above-described method of manufacturing a nitride system III–V compound layer will be described herein later. Here, detailed description for the same steps as those for the method of manufacturing a nitride system III–V compound layer is omitted.

Figure 5A:
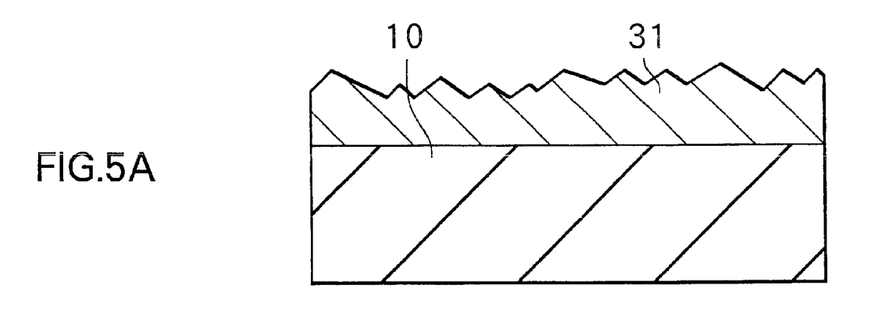
FIGS. 5A to 5C are cross sections of manufacturing steps of a method of manufacturing a substrate according to the embodiment of the invention.

As shown in FIG. 5A, the growth base 10 is prepared and cleaned with, e.g., an organic solvent. After performing thermal cleaning on the growth base 10, for example, the nitride system III–V compound such as GaN is grown on the growth base 10 to achieve a desired thickness (e.g, 200 $\mu$m) using, e.g., a HVPE method, thus a first growth layer 31 is formed (First growth step). At this time, the growth rate in a vertical direction to the growth surface is over 10 $\mu$m/h, for example. Dislocation with a high density occurs in the first growth layer 31 similar to the first growth layer 21, although it is not shown in the drawing.

Figure 5B:
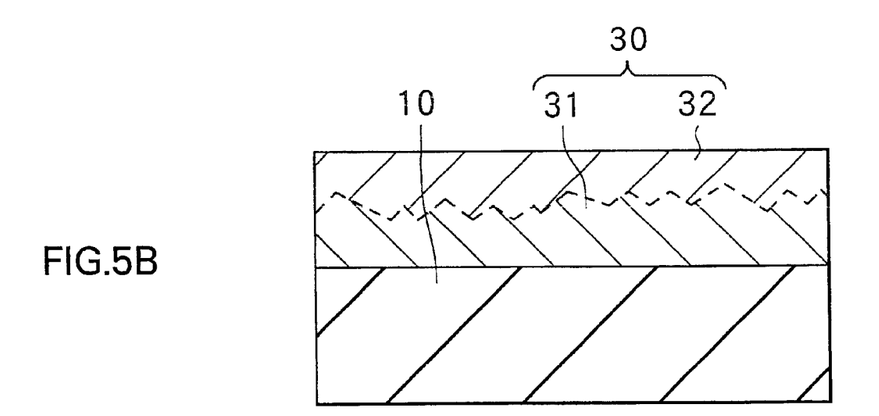

After the first growth step, for example, the same nitride system III–V compound as that constituting the fist growth layer 31 is grown on the first growth layer 31 using any one of a HVPE method, MOCVD method or MBE method at the growth rate lower than that used when growing the first growth layer 31, thus a second growth layer 32 with a flat surface is formed as shown in 5B. At this time, the growth rate in a vertical direction to the growth surface is below 10 $\mu$m/h, for example. Thus, a nitride system III–V compound substrate 30 consisting of the first growth layer 31 and the second growth layer 32 is manufactured. Here, growth takes place laterally so as to fill the depressions of the surface of the first growth layer 31 similar to the method of manufacturing a nitride system III–V compound layer. Thus, the dislocation (not shown) extending from the first growth layer 31 bends, so that the density of the dislocation propagating to the surface of the second growth layer 32 is considerably lowered.

Figure 5C:
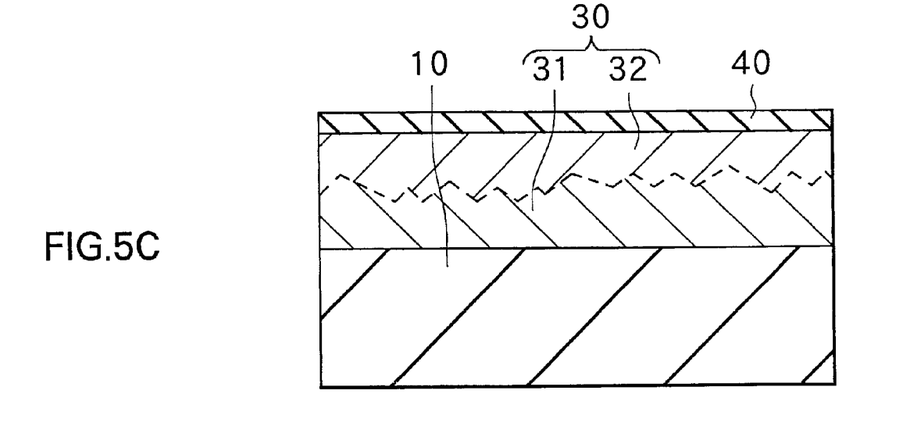

After forming the second growth layer 32, as shown in FIG. 5 (C) a protecting film 40 made of silicon dioxide ($SiO_2$) is formed so as to cover the surface of the second growth layer 32 using, e.g., a chemical vapor deposition (CVD) method. The protecting film 40 protects the nitride system III–V compound substrate 30 (the second growth layer 32) in the step of removing a growth base to be described later.

Figure 6A:
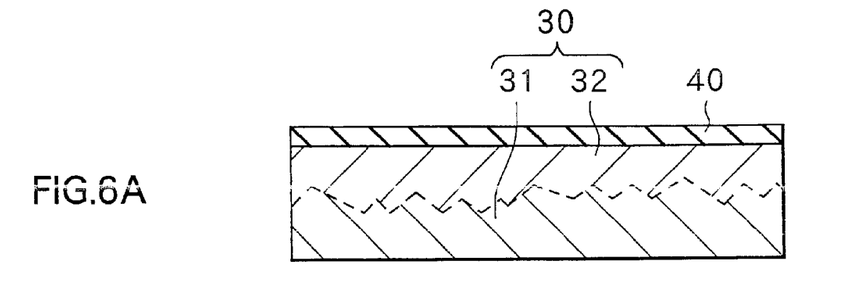
FIGS. 6A and 6B are cross sections of manufacturing steps following the steps of FIGS. 5A to 5C.

After the formation of the protecting film 40, as shown in FIG. 6A wet etching is performed at a temperature of 285° C. using an etchant including 1:1 (volume ratio) of phosphoric acid ($H_3PO_4$) and sulfuric acid ($H_2SO_4$), for example. Thus, the growth base 10 is removed. At this time, the second growth layer 32 is hardly damaged or contaminated since the second growth layer 32 is covered with the protecting layer 40.

Alternatively, removal of the growth base 10 may be performed by means of dry etching or lapping. When dry etching is performed for the removal, chlorine gas ($Cl_2$) is used as an etching gas, for example. When lapping is performed for the removal, diamond polishing powder is used, for example.

Further, by performing heating and cooling on the growth base 10 in which the nitride system III–V compound substrate 30 is formed, the nitride system III–V compound substrate 30 may be removed from the growth base 10. In this method, stress caused by the difference in the thermal expansion coefficient of the growth base 10 and the nitride system III–V compound substrate 30 is utilized. Specifically, for example, the growth base 10 is set inside the reaction tube of an infrared furnace, and the growth base 10 is heated to, e.g., 800° C. and then cooled down. Thus, the growth base 10 is removed from the nitride system III–V compound substrate 30. At this time, the removal may be performed in conjunction with lapping or the like. As the means for heating, heating with a heater or high frequency induction heating may be applied in addition to the heating using the infrared furnace.

Figure 6B:
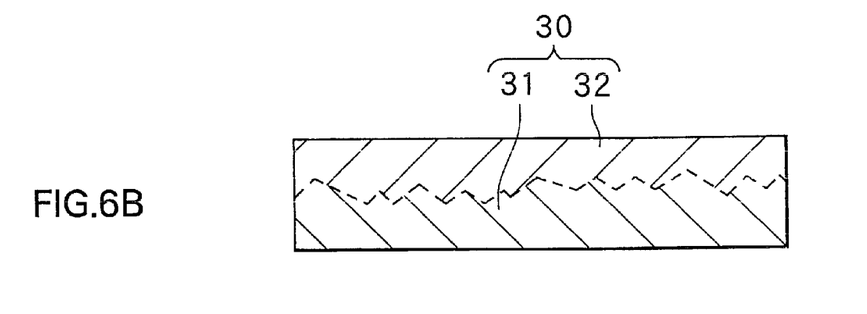

After removing the growth base 10, as shown in FIG. 6B, the protecting film 40 is removed using an etchant including, e.g., fluorine (HF). Thereafter, the surface of the second growth layer 32 is flattened as needed. Specifically, the surface of the second growth layer 32 is flattened by etching the surface using a vapor phase etching method or a liquid phase chemical etching method, or by polishing the surface using a machinery chemical polishing method, for example. By this treatment, the surface is finely flattened and a nitride system III–V compound semiconductor layer with great crystallinity is grown on the nitride system III–V compound substrate 30. Further, properties of the nitride system III–V compound substrate 30 such as thermal distribution can be adjusted.

The nitride system III–V compound substrate 30 manufactured above is used as a substrate when forming semiconductor light-emitting devices or transistors by sequentially growing nitride system III–V compound semiconductor layers thereon. With this type of semiconductor light-emitting device, generally a pair of electrodes is provided on the front surface on a substrate. However, with the nitride system III–V compound substrate 30 of the embodiment, the substrate can be made as a p-type substrate or an n-type substrate by doping impurities, so that there is an advantage such that a pair of electrodes can provided on front and back surfaces of the substrate, respectively. In a case where a semiconductor laser is manufactured as the semiconductor light-emitting device, since cleavage easily occurs, end faces of a resonator are easily formed. That is, with the use of the nitride system III–V compound substrate 30 of the embodiment, highly reliable semiconductor devices can be manufactured with excellent yield.

According to the method of manufacturing a nitride system III–V compound layer of the embodiment and the method of manufacturing a nitride system III–V compound substrate of the embodiment, the second growth layers 22 and 32 are grown at the lower growth rate than that used for the growth of the first growth layers 21 and 31, so that the good-quality nitride system III–V compound layer 20 and the nitride system III–V compound substrate 30 are manufactured with high productivity.

More specifically, the surfaces of the first growth layers 21 and 31 which is grown at a high growth rate are rough, but the surfaces of the second growth layers 22 and 32 are flatten by growing the second growth layers 22 and 32 at a lower growth rate than that used for the growth of the first growth layers 21 and 31 to fill the depressions of the surfaces of the first growth layers 21 and 31. Further, the growth takes place laterally so as to fill the depressions of the surfaces of the first growth layers 21 and 31. Therefore, the dislocation D extending from the first growth layers 21 and 31 laterally bends, thereby dramatically lowering the density of the dislocation D propagating to the surface of the second growth layers 22 and 32. Thus, the nitride system III–V compound layer 20 (or the nitride system III–V compound substrate 30) has a great property such that the nitride system III–V compound semiconductor with excellent crystallinity can be grown thereon.

The growth of the first growth layers 21 and 31 are performed for the growth rate in a vertical direction to the growth surface to be approximately 10 $\mu$m/h. Thus, a predetermined thickness can be achieved by growing these layers only for a short period of time. Further, a buffer layer does not have to be provided between the growth base 10 and the nitride system III–V compound layer 20 (or the nitride system III–V compound substrate 30), thus the manufacturing process is facilitated. Specifically, as compared to the case where a low temperature buffer layer is provided as a buffer layer, the growth temperature does not need to be changed drastically, thereby reducing manufacturing time.

However, the present invention has been described above by exemplifying the embodiment, the present invention is not limited to the above embodiment and various modifications are possible. For example, however, in the above embodiment, the same nitride system III–V compounds are grown to constitute the first growth layers 21 and 31 and the second growth layers 22 and 23, different nitride system III–V compound layers may be grown.

Figure 7:
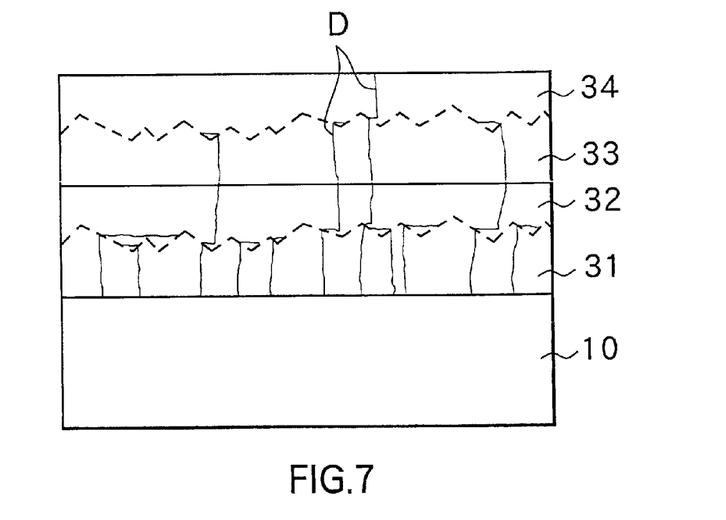
FIG. 7 is a cross section of a modification of the method of manufacturing a substrate according to the embodiment of the invention.

In the above embodiment, described is a case where the first growth layers 21 and 31 and the second growth layers 22 and 23 are grown to constitute the nitride system III–V compound layer 20 (or the nitride system III–V compound substrate 30). However, as shown in FIG. 7, for example, it is possible that after the growth of the second growth layers 22 and 32, a third growth layer 33 is grown on the second growth layers 22 and 32 at a high growth rate similar to that used when growing the first growth layers 21 and 31 and further a fourth growth layer 34 is grown at a low growth rate similar to that used when growing the second growth layers 22 and 32. By the provision of the third growth layer 33 and the fourth growth layer 34, the density of dislocation D is further lowered. Furthermore, when another nitride system III–V compound is grown on the fourth growth layer 34 at a different growth rate, the density of dislocation may be further lowered.

In the above embodiment, however, the HVPE method is performed using ammonia as a nitrogen source, a source material of hydrazine system which is expressed by the chemical formula, $N_2R_4$ (R denotes a hydrogen atom and an alkyl group) or organic amine may be used as a nitrogen source. Examples of the source material of hydrazine system which is expressed by $N_2R_4$ are hydrazine, monomethylhydrazine and dimethylhydrazine. Examples of the organic amine are propylamine, isopropylamine, butylamine, isobutylamine, t-butylamine or secondary butylamine, which are the primary amine, dipropylamine, diisopropylamine, dibutylamine, diisobutylamine, di-t-butylamine or di-secondary butylamine, which are the secondary amine and tripropylamine, triisopropylamine, tributylamine, triisobutylamine, tri-t-butylamine, tri-secondary butylamine, triallylamine, triethylamine, diisopropylmethylamine, dipropylmethylamine, dibutylmethylamine, diisobutylmethylamine, di-secondary butylmethylamine or di-t-butylmethylamine, which are the tertiary amine.

In the above embodiment, the HVPE method is performed using hydrogen chloride as hydride, but hydrogen fluoride (HF), hydrogen bromide (HBr) or hydrogen iodide (HI) may be used as the hydride.

In the above embodiment, the protecting film 40 is formed of silicon dioxide, but may be formed of silicon nitride ($Si_xN_y$).

In the above embodiment, the HVPE method is performed using nitrogen gas as a carrier gas. However, inert gas such as helium gas (He) or argon gas (Ar) may be used as the carrier gas. Further, hydrogen gas ($H_2$) or mixed gas including hydrogen gas may be also used as necessary.

In the above embodiment, described is a case where the growth base 10 is removed from the nitride system III–V compound substrate 30 by performing heating and cooling, but the growth base 10 may be removed from the nitride system III–V compound substrate 30 by only performing heating.

Moreover, in the above embodiment when the growth base 10 is made of sapphire, the nitride system III–V compound is grown on the c-plane of sapphire but may be grown on planes with other bearing.

According to the method of manufacturing a nitride system III–V compound layer and the method of manufacturing a substrate of the present invention, the first growth step for growing the first growth layer at the first growth rate and the second growth step for growing the second growth layer at the second growth rate lower than the first grow rate are provided. Thus, the surface of the first growth layer is rough, but the second growth layer is grown so as to flatten the rough surface in the second growth step. Further, in the second growth step, in order to flatten the rough surface, the second growth layer is grown also in the different direction from that of the first step. Therefore, even in a case where defects such as dislocation occur in the first growth step and the second growth layer is affected by the defects, the density of defects on the surface is lowered in the second growth step. Accordingly, a nitride system III–V compound layer or a nitride system III–V compound substrate with high properties on which a nitride system III–V compound semiconductor with excellent crystallinity can be grown is obtained.

Further, unlike conventional methods, a buffer layer does not have to be provided between the growth base and the nitride system III–V compound layer or the nitride system III–V compound substrate, so that the manufacturing process is facilitated.

According to the method of manufacturing a nitride system III–V compound layer and the method of manufacturing a substrate of one aspect of the invention, the first growth layer is grown at the growth rate in the vertical direction to the growth surface, higher than 10 $\mu$m/h in the first growth step, so that it can achieve a predetermined thickness by growing for a short time. Thus, the manufacturing time is reduced.

According to the method of manufacturing a substrate of another aspect of the invention, in at least one of the first growth step and the second growth step, the first growth layer or the second growth layer is grown after doping impurities. Thus, when manufacturing a device using this substrate, electrodes can be provided on front and back surfaces of the substrate.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a nitride system III–V compound layer including at least one select d from a group consisting of gallium (Ga), aluminum (Al), boron (B) and indium (In) as a group III element and at least nitrogen (N) as a group V element, the method, comprising a first growth step for growing a first growth layer including a nitride system III–V compound at a first growth rate, and a second growth step for growing a second growth layer including the nitride system III–V compound at a second growth rate lower than the first growth rate, wherein the first growth layer is grown using hydride as a source gas with a vapor phase epitaxy method in the first growth step.

2. A method of manufacturing a nitride system III–V compound layer according to claim 1, wherein the first growth layer is grown at a growth rate, in a direction vertical to the growth surface, higher than 10 $\mu$m/h in the first growth step and the second growth layer is grown at a growth rate, in a direction vertical to the growth surface lower than 10 $\mu$m/h in the second growth step.

3. A method of manufacturing a nitride system III–V compound layer according to claim 1, wherein the second growth layer is grown using hydride as a source gas with any one of a vapor phase epitaxy method, a metal organic chemical vapor deposition method or a molecular beam epitaxy method in the second growth step.

4. A method of manufacturing a nitride system III–V compound layer according to claim 1, wherein the first growth layer and the second growth layer are grown on a growth base which includes any one of sapphire ($Al_2O_3$), silicon carbide (SiC) or spinel ($MgAlO_4$).

5. A method of manufacturing a nitride system III–V compound layer according to claim 1, wherein gall um nitride (GaN) is grown in at least one of the first growth step and the second growth step.

6. A method of manufacturing a nitride system III–V compound layer according to claim 1, wherein the first growth layer or the second growth layer is grown after doping impurities.

7. A method of manufacturing a substrate made of a nitride system III–V compound including at leas one selected from a group consisting of gallium (Ga), aluminum (Al), boron (B) and indium (In) as a group III element and at least nitrogen (N) as a group V element, the method, comprising a first growth step for growing a first growth layer including a nitride system III–V compound at a first growth rate, and a second growth step for growing a second growth layer including the nitride system III–V compound at a second growth rate lower than the first growth rate, wherein the first growth layer is grown using hydride as a source gas with a vapor phase epitaxy method in the first growth step.

8. A method of manufacturing a substrate according to claim 7, wherein the first growth layer is grown at a growth rate, in a direction vertical to the growth surface, higher than 10 $\mu$m/h in the first growth step, and the second growth layer is grown at a growth rate, in a direction vertical to the growth surface, lower than 10 $\mu$m/h in the second growth step.

9. A method of manufacturing a substrate according to claim 7, further comprising a step for manufacturing a substrate by growing the first growth layer and the second growth layer on a growth base an then removing the growth base therefrom.

10. A method of manufacturing a substrate according to claim 9, wherein the growth base is removed by means of etching or lapping.

11. A method of manufacturing a substrate according to claim 9, wherein the growth base is removed by means of heating.

12. A method of manufacturing a substrate according to claim 9, further comprising a step for forming a protecting film to cover a surface of the second growth layer prior to the step for removing the growth base.

13. A method of manufacturing a substrate according to claim 7, further comprising a step for flattening a surface of the second growth layer after the second growth step.

14. A method of manufacturing a substrate according to claim 7, wherein gallium nitride (GaN) is grown in at least one of the first growth step and the second growth step.

15. A method of manufacturing a substrate according to claim 7, wherein at least one of the first growth layer and the second growth layer is grown after doping impurities.

16. A method of manufacturing a substrate according to claim 15, wherein at least one selected from a group consisting of carbon (C), silicon (Si), germanium (Ge), tin (Sn), sulfur (S), selenium (Se), tellurium (Te), beryllium (Be), magnesium (Mg), calcium (Ca), zinc (Zn) and cadmium (Cd) is doped as the impurities.

* * * * *